US 6,690,189 B2

(12) United States Patent
Mori et al.

(10) Patent No.: US 6,690,189 B2
(45) Date of Patent: Feb. 10, 2004

(54) APPARATUS AND METHOD FOR TESTING SEMICONDUCTOR INTEGRATED CIRCUIT

(75) Inventors: Hisaya Mori, Hyogo (JP); Shinji Yamada, Hyogo (JP); Teruhiko Funakura, Tokyo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 90 days.

(21) Appl. No.: 09/927,404

(22) Filed: Aug. 13, 2001

(65) Prior Publication Data

US 2002/0108080 A1 Aug. 8, 2002

(30) Foreign Application Priority Data

Feb. 8, 2001 (JP) ......................... 2001-032847

(51) Int. Cl.[7] .................. G01R 31/02; G01R 31/26; G01R 31/28
(52) U.S. Cl. ............. 324/765; 324/763; 324/158.1; 714/733; 714/734
(58) Field of Search ............. 324/158.1, 754–765; 714/724–734

(56) References Cited

U.S. PATENT DOCUMENTS

| | | | | |
|---|---|---|---|---|
| 6,028,431 A | * | 2/2000 | Hashida | 324/537 |
| 6,408,412 B1 | * | 6/2002 | Rajsuman | 714/724 |
| 6,449,741 B1 | * | 9/2002 | Organ et al. | 714/724 |

FOREIGN PATENT DOCUMENTS

| | | |
|---|---|---|
| JP | 8-233912 | 9/1996 |
| JP | 9-189750 | 7/1997 |

* cited by examiner

Primary Examiner—Kamand Cuneo
Assistant Examiner—Emily Y Chan
(74) Attorney, Agent, or Firm—McDermott, Will & Emery

(57) ABSTRACT

There are provided a test apparatus and method for testing a semiconductor integrated circuit which enables improvements in the ease of operation and convenience of a BOST device and shortening of a test time. Numeric codes are assigned to tests. A test apparatus is equipped with memory and an analysis section. A test requirement table—in which hardware requirements required for conducting a test are set on a per-numeric-code basis—is stored in the memory. Test requirements corresponding to a numeric code are read from the memory, whereupon a test is performed. The analysis section analyzes a digital test output and sends the result of analysis to an external controller.

8 Claims, 7 Drawing Sheets

APPARATUS AND METHOD FOR TESTING SEMICONDUCTOR INTEGRATED CIRCUIT

BACKGROUND OF THE INVENTION

1. Field of the Invention

The present invention relates to an apparatus for testing a semiconductor integrated circuit, and more particularly to an apparatus and method for testing a semiconductor integrated circuit including an A/D (analog-to-digital) converter circuit for converting an analog signal into a digital signal and a D/A (digital-to-analog) converter circuit for converting a digital signal into an analog signal.

2. Background Art

Recently, in relation to a system LSI embodied in a one-chip semiconductor integrated circuit (a one-chip LSI) consisting of a plurality of functionally-systematized circuit modules or embodied in a hybrid integrated circuit (a chip set LSI), combination of high-performance and precision digital and analog circuits (i.e., a system LSI handling a mixed signal) has been rapidly pursued. Even in relation to a test apparatus for use with a semiconductor integrated circuit, development of a test apparatus capable of handling a mixed signal is also pursued. Tester manufacturers have provided testers coping with a semiconductor integrated circuit using a mixed signal.

A tester compatible with a semiconductor integrated circuit using a mixed signal has a tendency to become expensive in the course of ensuring compliance with high performance specifications. For this reason, moves are afoot to recycle an existing low-speed, low-precision tester which has been used for, e.g., a logic LSI, to thereby avoid a hike in the price of a tester.

A big problem with such a test apparatus lies in a characteristic test for a D/A converter circuit for converting a digital signal into an analog signal (digital-to-analog converter, hereinafter called a "DAC") as well as in a characteristic test for an A/D converter circuit for converting an analog signal into a digital signal (hereinafter called an "ADC"). In association with an increase in the precision of the characteristic test, embodiment of a low-cost test apparatus compatible with a semiconductor integrated circuit including the DAC and ADC has posed a challenge.

In a testing environment of a general tester, a plurality of DUT (device under test) circuit boards (simply called "DUT boards") and connection jigs for connecting a tester with a DUT, such as cables, are provided at a plurality of points along a measurement path extending from measurement equipment provided in the tester to a semiconductor integrated circuit under test (hereinafter called a "DUT"). Further, the measurement path is long and accounts for occurrence of noise and a drop in measurement accuracy. Further, simultaneous testing of a plurality of DUTs is also impossible. A limitation is imposed on the speed of a low-speed tester, and hence the low-speed tester cannot conduct a test at a real operating speed, thereby posing a fear of an increase in a time required for conducting mass-production testing of a system LSI.

Japanese Patent Application Laid-Open No. 316024/1989 describes a tester. The tester is equipped with a memory device for storing conversion data at an address designated by input data which have been entered into a DAC of a test circuit. An analog signal which has been subjected to digital-to-analog conversion is inputted to an ADC, and an output from the ADC is sequentially stored in the memory device. After conversion of all the input data sets has been completed, the conversion data stored in the memory device are sequentially delivered to a tester. The tester sequentially compares the input data with the conversion data, thus producing a test conclusion.

However, the tester must supply data to be inputted to the DAC, an address to be used for storing conversion data into a memory device, and a control signal. Moreover, data stored in the memory device must be supplied to the tester. Further, there is the probability that noise arising in a long measurement path extending from the tester to a DUT may deteriorate precision of measurement. Further, the majority of pin electronics provided on the tester are occupied for testing a single DUT, thereby posing a difficulty in simultaneous measurement of a plurality of DUTs.

Further, communication for transmitting conversion data to the tester is time consuming, and test conclusions are produced after completion of all tests. Hence, shortening of a test time is also difficult.

SUMMARY OF THE INVENTION

The present invention has been conceived to solve such a problem and is aimed at providing an apparatus and method of testing a semiconductor integrated circuit, which apparatus and method facilitate operation of a BOST device and improve the convenience thereof.

According to one aspect of the present invention, an apparatus for testing a semiconductor integrated circuit comprises a test circuit board configured to transmit signals to and receive signals from a semiconductor integrated circuit to be tested that comprises an A/D converter circuit to convert analog signals to digital signals and a D/A converter circuit to convert digital signals to analog signals, a test ancillary device which is disposed in the vicinity of the test circuit board and is connected to the test circuit board, and an external controller which assigns a numeric code to a test on the semiconductor integrated circuit to be performed by the test ancillary device and which transmits the numeric code to the test ancillary device. The test ancillary device comprises memory having stored therein a test requirement table in which hardware requirements required for conducting a test are set on a per-numeric-code, an analysis section for reading test requirements corresponding to the numeric code from the test requirement table; a data circuit which supplies a digital test signal to the D/A converter circuit of the semiconductor integrated circuit to be tested on the basis of the test requirements, a testing D/A converter circuit which converts the digital test signal from the data circuit into an analog test signal and supplies the analog test signal to the A/D converter circuit of the semiconductor integrated circuit to be tested, a testing A/D converter circuit which converts an analog test output from the D/A converter circuit of the semiconductor integrated circuit to be tested into a digital test output, and measured data memory for storing a digital test output from the A/D converter circuit of the semiconductor integrated circuit to be tested and the digital test output from the testing A/D converter circuit. A result of analysis of the each digital test outputs stored in the measured data memory, the analysis being performed by the analysis section, is sent to the external controller.

By means of the test apparatus and the test method according to the present invention, numeric codes are assigned to tests to be performed by a DUT. The test apparatus is equipped with memory, and a test requirement table having stored therein specification evaluation values stored therein. A test requirement table in which hardware requirements required for conducting a test are set for each numeric code is stored in the memory. Test requirements corresponding to the numeric code are read from the test requirement table, and a test is performed. A result of test is compared with specification evaluation values, whereby the test result is evaluated. Thus, evaluation of a test result as well as conduction of a test can be performed in the BOST device. Thus, there is no necessity of acquiring measured data into a tester. Hence, the ease of operation and convenience of the BOST device are improved, shortening of a test time becomes feasible.

Other and further objects, features and advantages of the invention will appear more fully from the following description.

DETAILED DESCRIPTION OF THE PREFERRED EMBODIMENTS

First Embodiment

A first embodiment of the present invention will now be described by reference to a drawing.

Figures 6A, 6B, 6C:
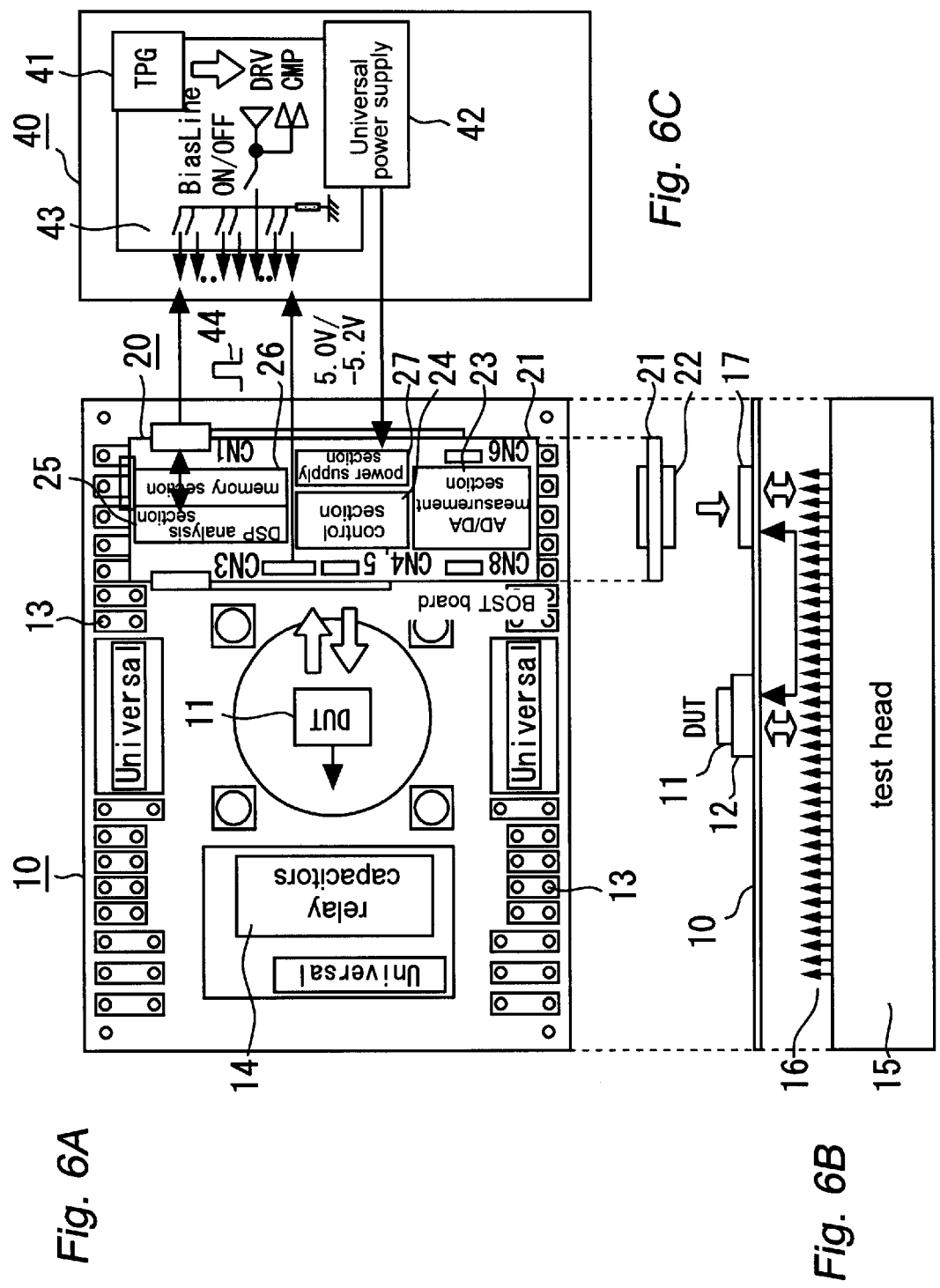
FIGS. 6A through 6C are schematic diagrams showing the configuration of a test apparatus for testing a semiconductor integrated circuit embodying this invention.

FIGS. 6A through 6C are schematic diagrams showing the configuration of a test apparatus for testing a semiconductor integrated circuit embodying this invention.

FIG. 6A is a top view of a DUT board; FIG. 6B is a side view of the DUT board; and FIG. 6C is a schematic diagram showing the configuration of a test machine (tester).

The test apparatus comprises a DUT board 10; a test ancillary device (also called a BOST (built-off self-test) device)) 20; and a tester 40.

The DUT board 10 is designed for testing a molded IC designated by a DUT 11. A molded IC is a semiconductor integrated circuit (IC) chip which is coated with mold resin such that a plurality of terminals are led outside from the mold resin. The IC chip mounted on the DUT 11 is, for example, a one-chip system LSI of mixed signal type. A DAC for converting a digital signal into an analog signal and an ADC for converting an analog signal into a digital signal are provided within a single chip. A hybrid integrated circuit (IC) of mixed signal type comprising a plurality of chips mounted on a common circuit board may be employed as the DUT 11.

The DUT board 10 has a DUT socket 12 for receiving terminals of the DUT 11. A plurality of connection terminals 13 and a cluster of relay capacitors 14 for test purposes are provided around the DUT socket 12.

As shown in FIG. 6B, a test head 15 is located below the DUT board 10. The test head 15 has a plurality of connection pins 16 to be connected to the DUT board 10. Signals required for a test are exchanged with the DUT 11 by way of the connection pins 16.

A BOST device 20 is provided in the vicinity of the DUT board 10. In the example of the circuit shown in FIG. 6, the BOST device 20 is constituted on a test ancillary board (BOST board) 21. The BOST board 21 is to be mounted on the DUT board 10. A socket 17 is provided on the DUT board 10 for receiving the BOST board 21. A connector 22 to be fitted to the socket 17 is provided on a lower surface of the BOST board 21, and the connector 22 is fitted to the socket 17. As a result, the BOST board 21 is supported on the DUT board 10, so that signals are exchanged with the test head 15 by way of the socket 17.

As has been known well, the BOST board 21 is an external test ancillary device (built-off self-test device) for assisting a test circuit which causes a DUT to perform a built-in self-test therein without dependence on the tester 40. The BOST board 21 has an AD/DA measurement section 23, a control section 24, a DSP analysis section 25, a memory section 26, and a power supply section 27.

The tester 40 has a test pattern generator (hereinafter simply called a "TPG") 41, a power supply section 42, and a pin electronic section 43. The tester 40 supplies a supply voltage Vd to the BOST board 21, thus exchanging control signals 44 with the BOST board 21. The control signals 44 include a test analysis result signal sent from the BOST board 21 to the tester 40 as well as instruction signals sent from the tester 40 to the BOST board 21 and to the DUT board 10.

The control signals 44, which include a number code (a test analysis number code) and are output from the tester 40 to the BOST board 21, are produced as test pattern signals by the TPG 41 built in the tester 40 in compliance with test signal requirements described in a test program, as in the case of a test conducted on another DUT 11. The control signals 44 are supplied to the BOST board 21 and the DUT board 10, by way of the pin electronic section 43 of the tester 40 having a plurality of signal I/O pins. A test analysis result (pass/fail information) output from the BOST board 21 is delivered to the pin electronic section 43 of the tester 40. A determination section of the pin electronic section 43 acquires information about the test analysis result by comparison with a test pattern signal and through analysis of a comparison result.

Figure 7:
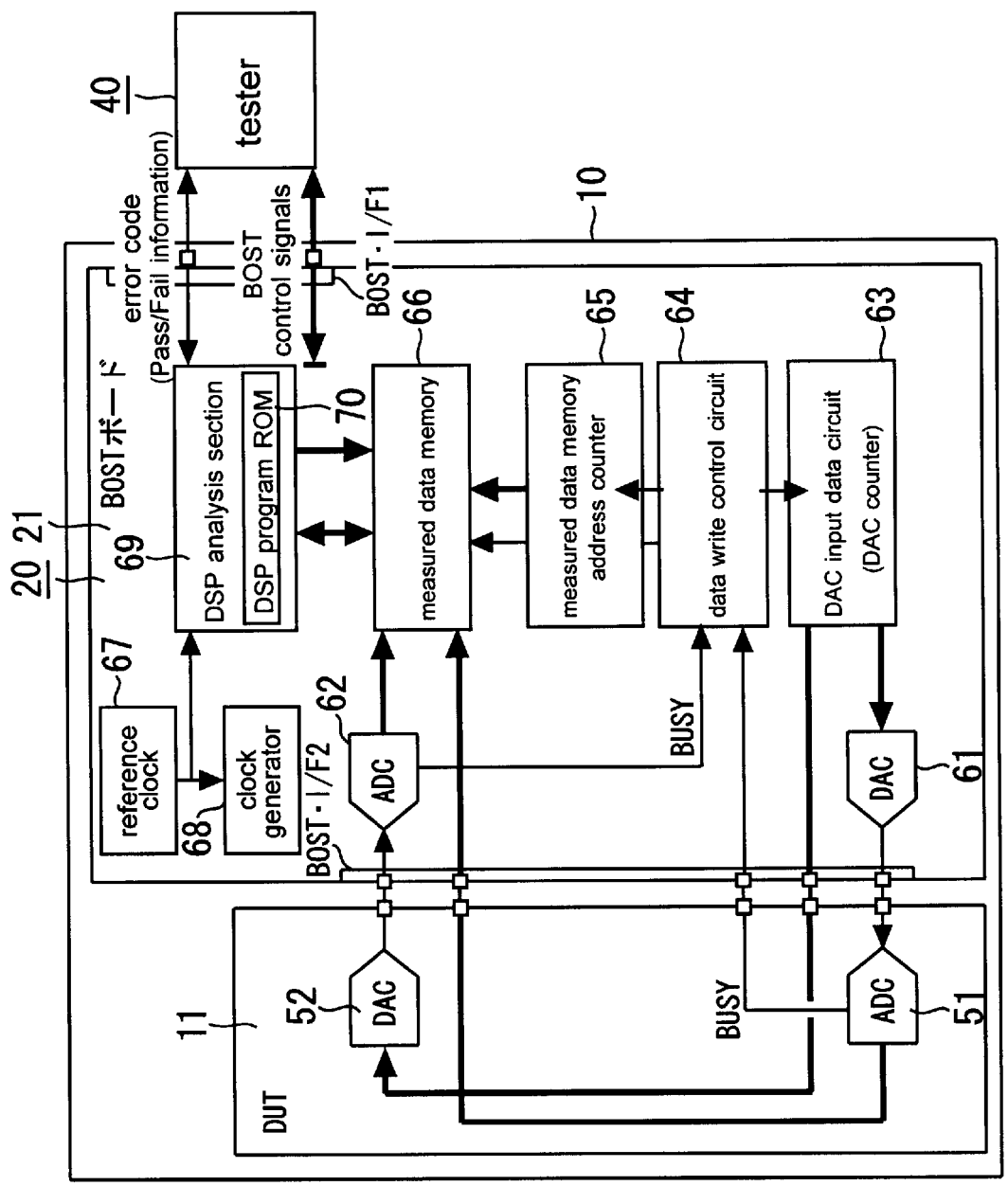
FIG. 7 is a block diagram showing the configuration of an electric circuit provided in the test apparatus shown in FIGS. 6A through 6C.

FIG. 7 is a block diagram showing the configuration of an electric circuit provided in the test apparatus shown in FIGS. 6A through 6C.

The DUT 11 comprises an ADC 51 for converting an analog signal into a digital signal, and a DAC 52 for converting a digital signal into an analog signal.

The BOST board 21 has a testing DAC 61 for test purpose which supplies an analog test signal to the ADC 51 of the DUT 11, and a testing ADC 62 for test purpose which converts an analog test output produced by the DAC 52 of the DUT 11 into a digital test output. Moreover, the BOST board 21 comprises a DAC input data circuit (DAC counter) 63; a data write control circuit 64; a measured data memory address counter 65; measured data memory 66; a reference clock signal circuit 67; a clock signal generator circuit 68; and a DSP analysis section 69. The DSP analysis section 69 has DSP program ROM 70.

The DAC 61, the ADC 62, the DAC input data circuit 63, the data write control circuit 64, and the measured data memory address counter 65 are included in the AD/DA measurement section 23 shown in FIGS. 6A through 6C. The measured data memory 66 is included in the memory section 26, and the DSP analysis section 69 is included in the DSP analysis section 25.

By means of such a configuration, a digital test signal (i.e., test data) is stored in the DAC input data circuit 63. In accordance with an instruction from the tester 40, the test data are supplied from the DAC input data circuit 63 to the DAC 52 of the DUT 11 and to the DAC 61 of the BOST board 21.

The test data supplied to the DAC 61 are converted into an analog test signal, and the analog test signal is supplied to the ADC 51. The ADC 51 converts the analog test signal into a digital test output, and the digital test output is supplied to the measured data memory 66.

Meanwhile, the test data which have been supplied directly to the DAC 52 of the DUT 11 from the DAC input data circuit 63 are converted into an analog test output by the DAC 52. The analog test output is converted into a digital test output by means of the ADC 62 of the BOST board 21. The digital test output is supplied to the measured data memory 66.

The measured data memory 66 sequentially stores to predetermined addresses the digital test output supplied from the ADC 51 of the DUT 11, and the digital test output supplied from the DAC 52 by way of the ADC 62.

The ADC 51 of the DUT 11 and the ADC 62 of the BOST board 21 convert an analog signal into a digital signal, sequentially. Every time a single digital signal is output, the ADC 51 and the ADC 62 each output a BUSY signal. The BUSY signals are supplied to the data write control circuit 64 provided on the BOST board 21. On the basis of the thus-supplied BUSY signals, the data write control circuit 64 sequentially advances the digital test data pertaining to the DAC input data circuit 63 to the next digital test data on a per-data-set basis. Further, the data write control circuit 64 acts on the measured data memory address counter 65 so as to sequentially advance an address of the measured data memory 66.

As mentioned above, a code of the digital test data to be converted by the DUT 11 is advanced by the DAC input data circuit 63. As a result of sequential advancement of an address on the measured data memory 66 at which the digital test output converted by the DUT 11 is to be stored, the ADC 51 and the DAC 52 provided in the DUT 11 sequentially pursue conversion required by a test. The thus-converted measured data are sequentially stored in the measured data memory 66. In subsequent processes, conversion tests proceed until a final code set by the DSP analysis section 69 on the BOST board 21 is achieved, and the results of all conversion tests are stored in the measured data memory 66.

After the ADC 51 and the DAC 52 of the DUT 11 have completed conversion tests, the DSP analysis section 69 provided on the BOST board 21 sequentially reads conversion data stored in the measured data memory 66, through use of a program stored in the DPG program ROM 70, thus analyzing a conversion characteristic. The analysis includes computation of an A/D conversion characteristic parameter, a D/A conversion characteristic parameter, a differential linearity, and an integral nonlinearity error. An analysis result (pass/fail information) is sent from the BOST board 21 to the tester 40, wherein the tester 40 processes a test result.

In the configuration shown in FIGS. 6A through 6C, the BOST board 21 is provided in the vicinity of the DUT board 10 and has the function of causing the ADC 51 and DAC 52 of the DUT 11 to perform conversion tests. The conversion tests can be effected on the BOST board 21.

Consequently, an analog measurement system line provided between the DUT board 10 and the BOST board 21 can be shortened, and occurrence of a measurement error attributable to noise can be suppressed sufficiently. Thus, a high-precision test can be implemented, and a test can be carried out at a higher speed on the basis of a signal exchanged between the DUT board 10 and the BOST board 21 located in the vicinity thereof.

An analog measurement system line can be obviated from an area between the BOST board 21 and the tester 40, thereby increasing the accuracy of a test. After required conversion tests have been completed on the BOST board 21, the results of conversion tests are sent to the tester 40. Thus, a test speed can be increased as compared with a case in which converted data are transmitted to the tester 40.

In the apparatus shown in FIGS. 6A through 6C, the conversion test function of the ADC 51 and that of the DAC 52 of the DUT 11 are implemented on the BOST board 21. Hence, there is no necessity of adding a powerful conversion test function to the tester 40. Hence, an increase in the cost of the tester 40 is prevented, thereby enabling diversion of a conventional low-speed tester to the test apparatus. When a tester 40 having a special measurement function is to be manufactured, limitations are imposed on expansion of capabilities of hardware configuration of a tester. Further, manufacture of such a tester 40 involves modifications to the tester itself, posing a fear of a hike in development costs.

The test apparatus shown in FIGS. 6A through 6C utilizes as standard equipment a TPG and pin electronics provided on a common tester. Configuration and control of a BOST board can be effected without being influenced by specifications of testers or restrictions. Thus, application of the test apparatus to various types of testers is feasible.

Figure 1:
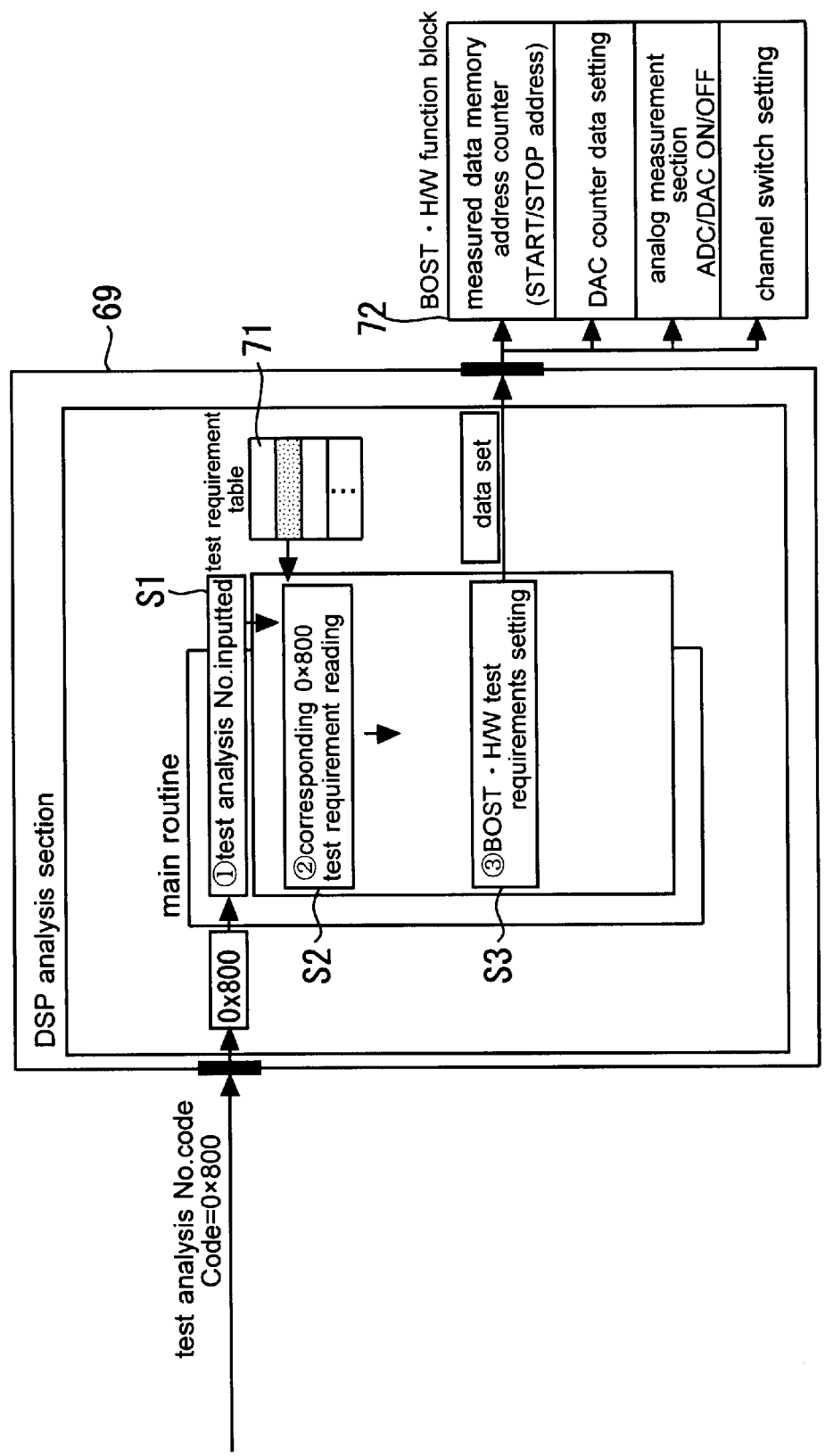
FIG. 1 is a schematic diagram showing the configuration of a DSP analysis section constituting the principal feature of the first embodiment and a test method according to the first embodiment.

FIG. 1 is a schematic diagram showing the configuration of a DSP analysis section constituting the principal feature of the first embodiment and a test method according to the first embodiment. The test apparatus shown in FIG. 1 is identical in configuration with that shown in FIGS. 6 and 7, exclusive of the DSP analysis section. Hence, these drawings are employed, and repeated explanation of the test apparatus is omitted.

In the present embodiment, numeric codes are assigned to tests on DUTs 11 to be performed by a BOST device 20. Requirements settings—which are required for a test and are to be made on hardware of the BOST device 20—are registered on a test requirement table 71 in FIG. 1 for each numeric code. The test requirement table 71 is stored in memory (not shown) integrated in a processor of a DSP analysis section 69 provided on the BOST device 20 or in memory (not shown) provided on a BOST device connected to the DUTs 11. When the numeric code (i.e., a test analysis number) is transmitted to the BOST device 20 from an external controller or the tester 40, the processor reads corresponding setting requirements from the test requirement table 71. The thus-read setting requirements are set in the hardware of the BOST device 20, whereupon a test is commenced.

Software processing to be performed in the processor of the DSP analysis section 69 will next be described. As shown in FIG. 1, (1) the numeric code assigned to a test (i.e., a test analysis number) which has been entered into the processor is inputted to the inside of the processor in step S1.

(2) Test requirements corresponding to the test analysis number that has been inputted are read from the test requirement table 71 in step S2.

(3) In step S3, the thus-read test requirements are set in a BOST hardware function block 72 provided outside the processor.

(4) Processing pertaining to (3) is iterated until all the requirement setting are completed.

Next will be described a circuit for performing a round of operations from entry of the test analysis number to setting of requirements on hardware of the BOST device 20 as well as the operation of the circuit.

Figure 2:
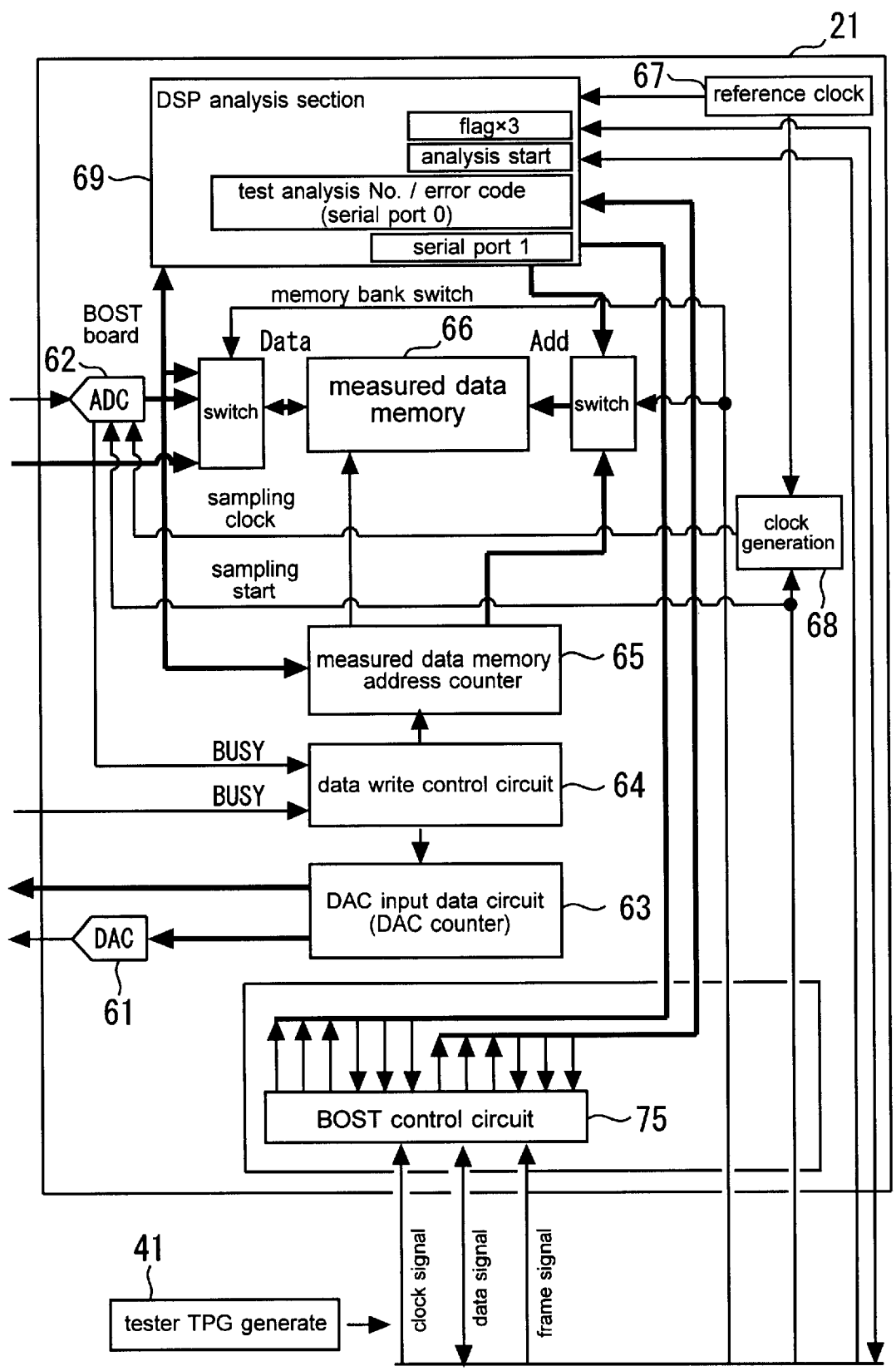
FIG. 2 is a signal control system diagram showing the flow of signals within a BOST board and a control system.

FIG. 2 is a signal control system diagram showing the flow of signals within a BOST board 21 and a control system. The series of processing operations are performed by the DSP analysis section 69 and a BOST control circuit 75 whose detailed circuit is shown in FIG. 3.

Operations of circuits shown in FIGS. 2 and 3 will be described.

(1) A frame signal (B-SFRAM), a data signal (B-SDATA), and a clock signal (B-SCLK) are inputted to a BOST control circuit 75 from an external controller, such as a TPG 41 of the tester 40. In connection with these signals, the frame signal is taken as an input start signal, and the data signal is serially inputted to the BOST device 20 in synchronism with the clock signal. The data signal following the frame signal in the next cycle is a mode M signal. When the mode M signal assumes a value of 0, the value means that the following serial data represent a test analysis number. When the mode M signal assumes a value of 1, the value means that the following serial data represent an IP address (identification address) assigned to each block of the hardware of the BOST device 20 and setting data to be written into the address or read from the address. When the signals are inputted from the external controller, such as a tester, to the BOST device 20, a mode R/W signal following the mode M signal in the next cycle assumes a value of 0. In contrast, when the signals are inputted from the BOST 20 to the external controller, such as a tester, the mode R/W signal assumes a value of 1. In short, the mode R/W signal shows the direction of the serial data signal.

Figure 3:
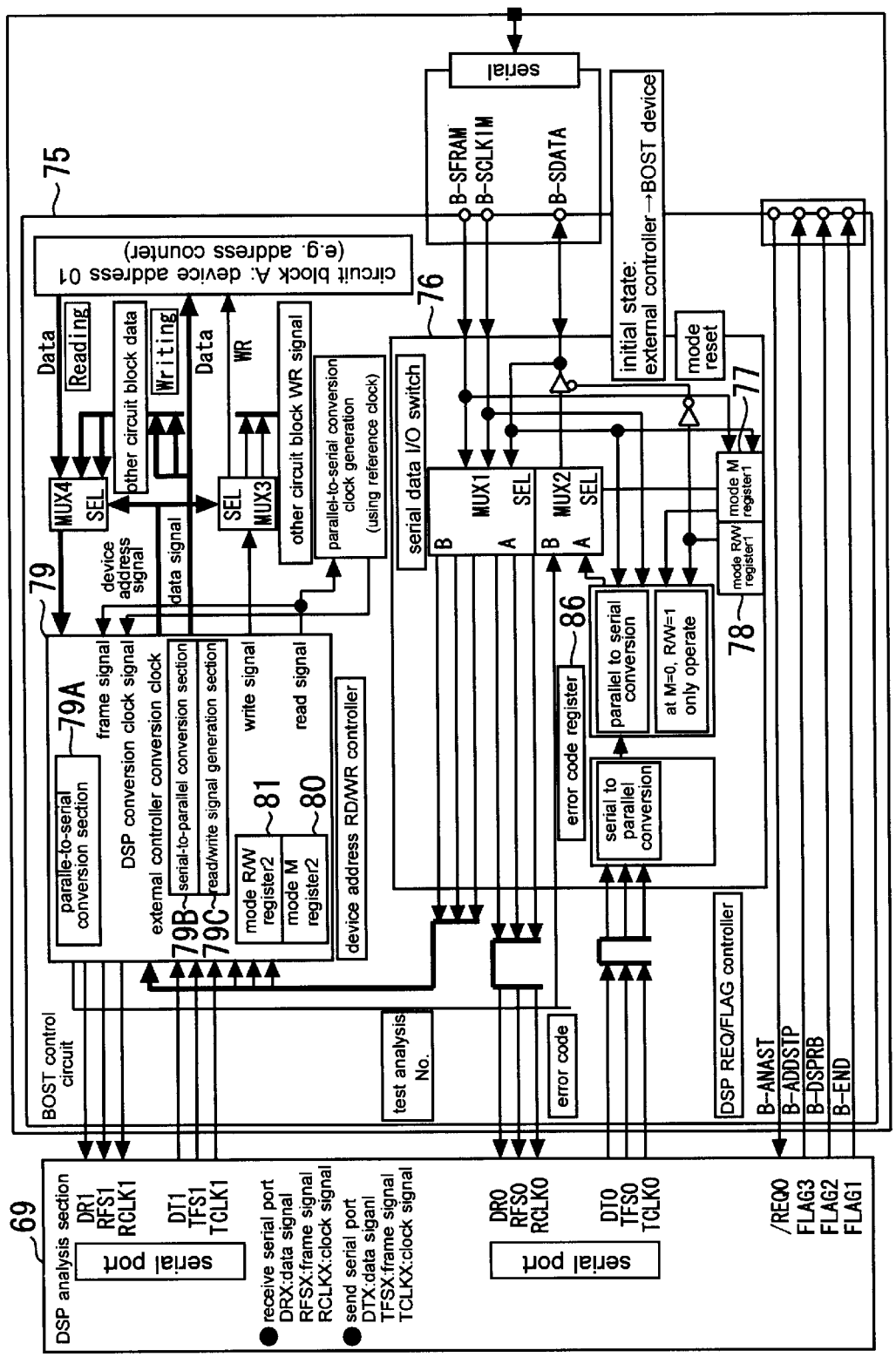
FIG. 3 is a schematic diagram showing the configuration of BOST control device, the flow of signals and a control system.

(2) When the test analysis number is inputted to the BOST device 20, a first mode M register 77 and a first mode R/W register 78 are reset by a frame signal by a serial data I/O switching section 76 shown in FIG. 3. At this time, a serial data I/O port is switched to the direction in which a signal is output from the external controller to the BOST device 20. Subsequently, mode information is set in the first mode M register 77 and the first mode R/W register 78. (3) Since the first mode M register 77 latches 0, a first switching circuit MUX1 of the serial data I/O switching section 76 causes the frame signal, the data signal, and the clock signal, which have been inputted to the BOST device 20, to enter a serial port 0 of the DSP analysis section 69, where the signals are subjected to software processing shown in FIG. 1.

(4) Requirements are set in the hardware of the BOST device 20 by the DSP analysis section 69, by the frame signal, the data signal, and the clock signal appearing at a serial port 1 of the DSP analysis section 69. The signals are inputted to the BOST control circuit 75. A serial-to-parallel conversion section 79B of a RD/WR control section 79 converts a device address signal and a data signal into parallel signals and retains the thus-converted parallel signals.

Since a second mode M register 80 and a second mode R/W register 81 assume a value of 0 after conversion, a read/write signal generation section 79C produces a write signal. The write signal is inputted to corresponding hardware along with the data signal, by way of a H/W write signal line assigned a corresponding device address signal by a third switching circuit MUX 3 which takes, as a switching signal, the device address signal that have been converted into a parallel signal. Data are retained by the write signal.

As in the case of the first mode M register 77, a second mode M register 80 selects a DSP analysis section when latching a value of 0 and signal groups output from the external controller when latching a value of 1. A second mode R/W register 81 operates in the same manner as the first mode R/W register 78.

(5) Meanwhile, when written data are verified by the DSP analysis section 69, processing identical with that mentioned previously is performed through use of the frame signal, the data signal, and the clock signal output from the serial port 1 of the DSP analysis section 69 as well as through use of the frame signal, the data signal, and the clock signal input to the serial port 1 of the DSP analysis section 69. At this time, on the basis of the information set on the second mode M register 80 and the second mode R/W register 81, the write/read signal generation section 79C produces a read signal. The read signal is taken as a reference signal to be used for producing a frame signal and a clock signal when H/W setting data are sent to the serial port 1 of the DSP analysis section 69. Reading operation of the DSP analysis section is as follows. Namely, in accordance with the device address signal retained by the serial-to-parallel conversion section 79B of the device address RD/WR control section 79, a fourth switching circuit MUX 4 selects corresponding H/W output data. A parallel-to-serial conversion section 79A of the RD/WR control section 79 converts the data into serial data, and the thus-converted serial data are inputted to the serial port 1 of the DSP analysis section 69. The DSP analysis section 69 receives the data and verifies the data through software processing. As mentioned previously, the read signal output from the read/write signal generation section 79 and a DSP-compatible conversion clock signal produced from the read signal by a clock signal generation section of the parallel-to-serial conversion section 79A are used as the frame signal and the clock signal used in entering data into the serial port 1.

The operations which have been described thus far correspond to the series of operations from entry of a test analysis number to setting of hardware requirements on the BOST device 20. In addition, setting data on the hardware of the BOST device 20 from the external controller and reading the setting data from the same can be effected for the purpose of verifying circuits of the BOST device 20. This can be effected when the mode M signal assumes a value of 1. In connection with writing of data, processing pertaining to (4) is performed through use of the signals output from the external controller rather than the signals output from the serial port 1 of the DSP analysis section 69. In connection with reading of data, data are inputted from the external controller in synchronism with the clock signal which is output from the external controller and is taken as a conversion clock signal of the parallel-to-serial conversion section 79A of the RD/WR control section 79 employed in the processing pertaining to (5).

The circuit configuration is controlled by a serial signal. Hence, the number of pins to be provided on a tester can be diminished as compared with a case where a circuit is controlled by the TPG 41 of the tester. As a result, limitations imposed on an increase in the number of DUTs 11 which can be measured simultaneously can be alleviated.

Since the circuit according to the first embodiment is configured in the manner as mentioned above, the processor of the DSP analysis section 69 of the BOST device 20 can download test requirements directly to individual sections of the BOST device 20 by transmission of only a test analysis number. Setting information to be output from the external controller is simplified, thus improving the ease of operation and convenience of the BOST device.

Further, as in the case of an analysis program, requirements for setting hardware of the BOST device 20 can be collectively managed by ROM of the processor provided in the DSP analysis section 69.

Further, there can be curtailed an excessive communications time, which would otherwise be caused when requirements are set from the outside of the BOST device 20, there by speeding up setting operation. Further, there is yielded an advantage of shortening of a test time.

Second Embodiment

A second embodiment of the present invention will now be described by reference to a drawing.

Figure 4:
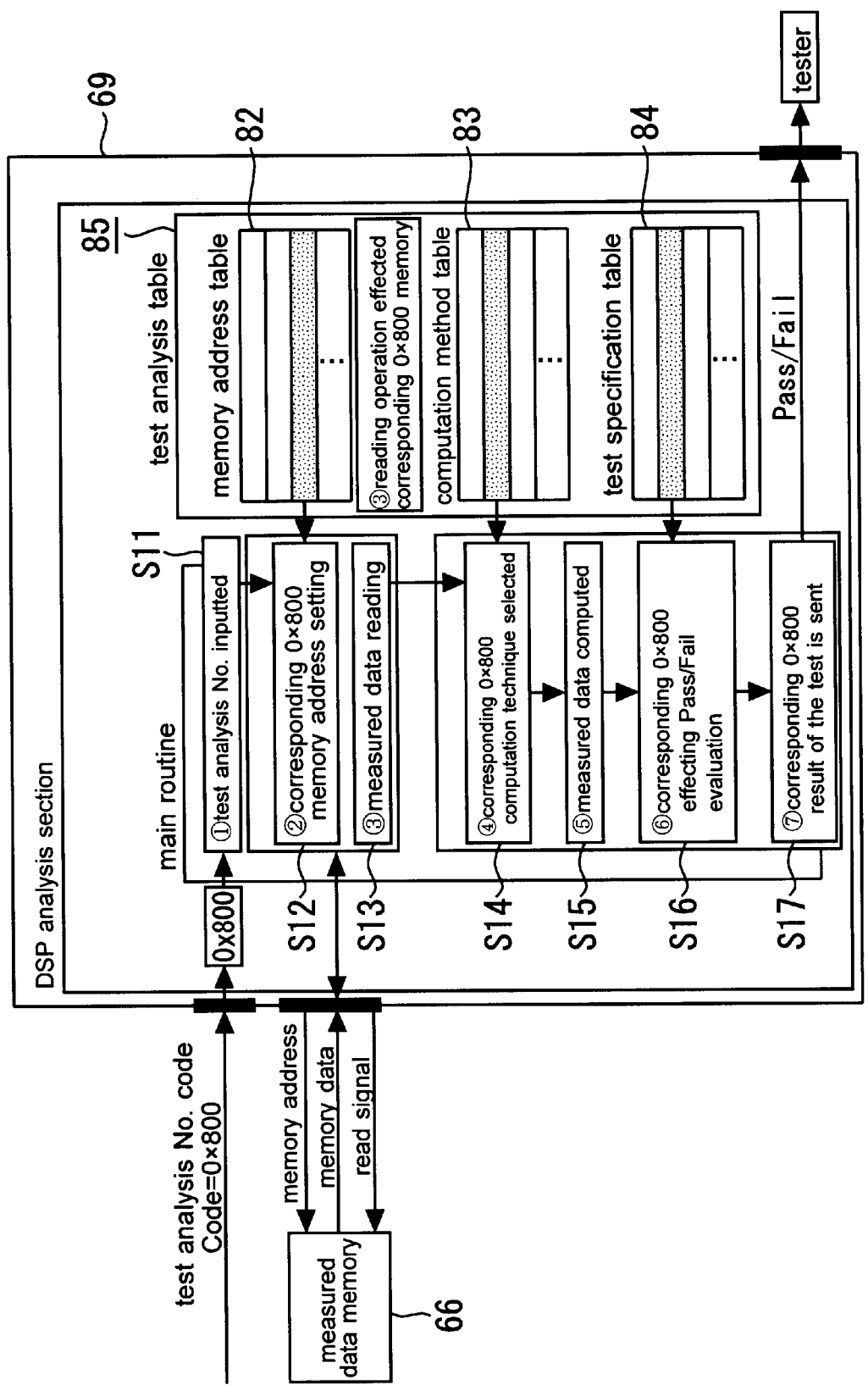
FIG. 4 is a schematic diagram showing the configuration of a DSP analysis section constituting the principal feature of the second embodiment and a test method according to the second embodiment.

FIG. 4 is a schematic diagram showing the configuration of a DSP analysis section constituting the principal feature of the second embodiment and a test method according to the second embodiment. The test apparatus shown in FIG. 4 is identical in configuration with that shown in FIGS. 6 and 7, exclusive of the DSP analysis section. Hence, these drawings are employed, and repeated explanation of the test apparatus is omitted.

As in the case of the first embodiment, in the present embodiment tests on the DUTs 11 to be performed by the BOST device 20 are converted into numeric codes. A test analysis table 85 has a memory address table 82 for setting an address of measured data memory in which measured data are stored on a per-numeric-code basis; a computation method table 83 in which computation method information required for conducting the tests is arranged in the form of a table for on a per-numeric-code basis; and a test specification table 84 in which specification evaluation values are arranged in the form of a table. The test analysis table 85 is stored in memory integrated in the processor of the DSP analysis section 69 provided on the BOST device 20 or in memory provided on a BOST device connected to the DUTs 11. When a test analysis number is transmitted to the BOST device 20 from the tester or the external controller and when an analysis start signal is inputted to the processor, the processor reads measured data from the measured data memory 66, thereby evaluating specifications. Test information result (pass/fail) is transmitted to the external controller.

Software processing to be performed in the processor of the DSP analysis section 69 will next be described. As shown in FIG. 4, (1) the numeric code assigned to a test (i.e., a test analysis number) which as been entered into the processor of the DSP analysis section 69 is inputted to the inside of the processor in step S1.

(2) An address on the measured data memory—in which are stored measured data corresponding to the test analysis number that has been inputted—is read from a memory address table 82 in step S12, and the thus-read address is set.

(3) In step S13 corresponding measured data are read from the measured data memory 66 on the basis of the memory address, and the thus-read measured data are inputted to the processor.

(4) A computation technique corresponding to the test analysis number that has been inputted is read from a computation technique table 83 in step S14.

(5) In step S15, ADC characteristic parameters and DAC characteristic parameters (i.e., a differential linearity and an integral nonlinearity error) of the DUTs 11 are computed from the measured data and by means of the computation technique.

(6) In step S16, a specification evaluation value corresponding to the test analysis number that has been inputted is read from the test specification table 84. The specification evaluation value is compared with a result of computation performed in step S15, thus effecting pass/fail evaluation.

(7) In step S17, a result of the test performed in step S16 is sent to the external controller.

Transmission of the test result will now be described.

When a test result is transmitted, information about the test result (also called "test result information") is latched in an error code register 86 by means of a frame signal, a data signal (representing test result information), and a clock signal, which are output from the serial port 0 of the DSP analysis section 69 shown in FIG. 3. In connection with reading of the information, the frame signal, the data signal, and the clock signal, which are output from the external controller, are inputted to the BOST device 20, wherein the data signal has imparted a value of "0" to mode M information and a value of "1" to mode R/W information. A second switching circuit MUX 2 selects an output from the error code register 86 and transmits the test result information to the external controller in synchronism with the clock signal.

Since the DSP analysis section according to the second embodiment is configured in the manner as mentioned above, the BOST device 20 effects pass/fail evaluation of an ordinary test. There is no necessity of transmitting and loading measured data to the tester, thereby improving the ease of operation and convenience of the BOST device.

As a result of simplification of a test result, an effect of shortening a test time can be expected.

Third Embodiment

A third embodiment of the present invention will now be described by reference to a drawing.

Figure 5:
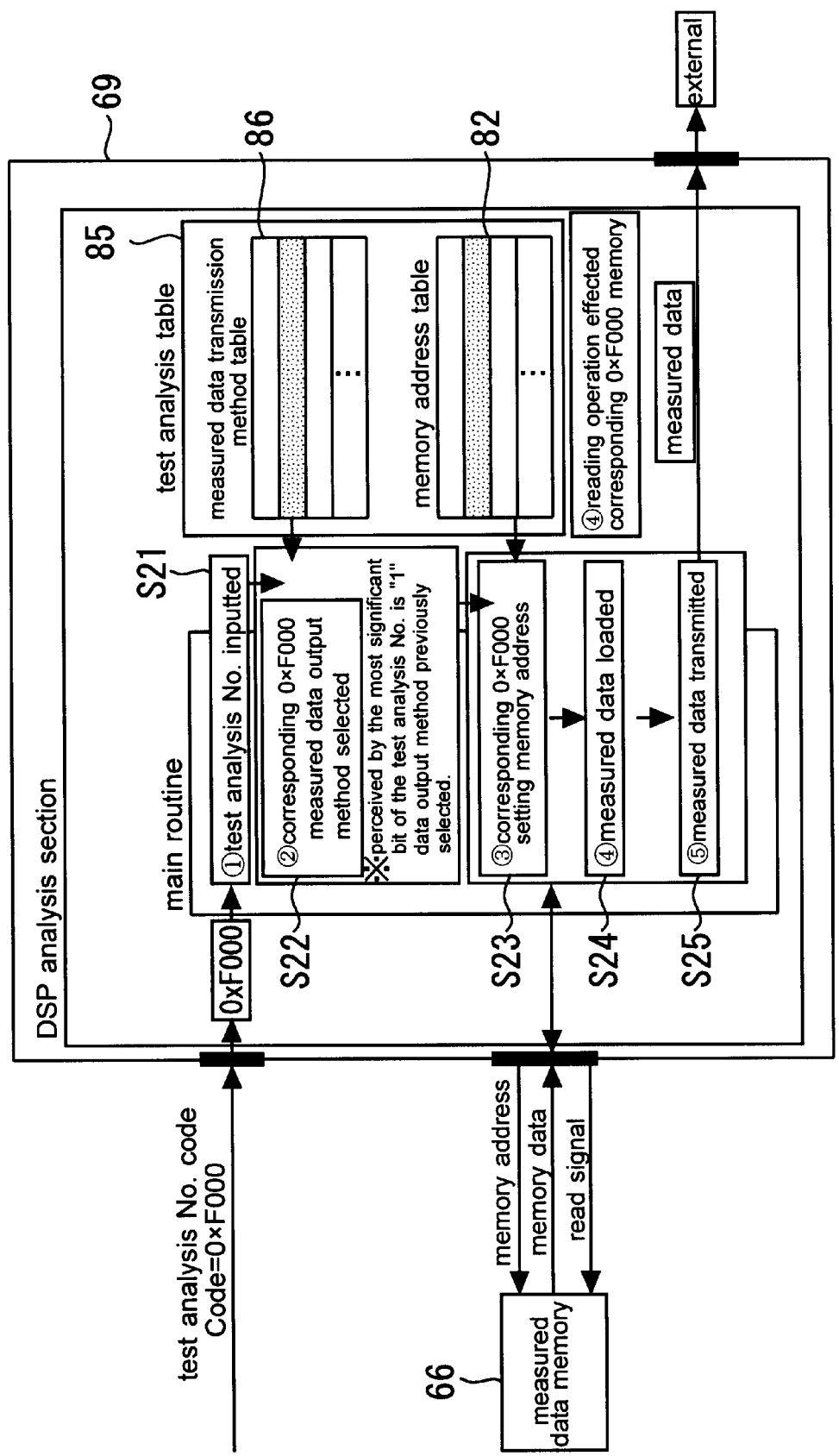
FIG. 5 is a schematic diagram showing the configuration of a DSP analysis section constituting the principal feature of the third embodiment and a test method according to the third embodiment.

FIG. 5 is a schematic diagram showing the configuration of a DSP analysis section constituting the principal feature of the third embodiment and a test method according to the third embodiment. The test apparatus shown in FIG. 5 is identical in configuration with that shown in FIGS. 6 and 7, exclusive of the DSP analysis section. Hence, these drawings are employed, and repeated explanation of the test apparatus is omitted.

As shown in FIG. 5, in the present embodiment, a measured data transmission method table 86 in which transmission methods for outputting measured data are stored is provided in the test analysis table 85. When there is transmitted a test analysis number corresponding to the table number stored in which the transmission method is stored, the processor of the DSP analysis section 69 provided on the BOST device 20 reads corresponding measured data from the measured data memory 66. The thus-read measured data are transmitted to the external controller.

Software processing to be performed in the processor of the DSP analysis section 69 will next be described.

As shown in FIG. 5, (1) The test analysis number input to the processor of the DSP analysis section 69 is inputted to the processor in step S21.

(2) For example, in a case where the most significant bit of the test analysis number is "0", the test analysis number is perceived as representing measured data processing. First, in step S22 a measured data output method corresponding to the test analysis number is read from the measured data transmission method table 86.

The measured data transmission method corresponds to software processing to be performed for outputting measured data to the outside.

(3) In step S23, an address on the measured data memory 66 in which are stored measured data corresponding to the test analysis number which has been inputted is read from the memory address table 82, and the thus-read address is set.

(4) In step S24, corresponding measured data are loaded from the memory address and into the processor of the DSP analysis section 69.

(5) In step S25, the measured data are transmitted to the outside.

Since the DSP analysis section according to the third embodiment is configured in the manner as mentioned above, measured data can be readily loaded from the outside. The measured data can be processed and cataloged outside of the DSP analysis section by means of software. The DSP analysis section can be used for conducting a normal test but also for evaluating and analyzing design of a DUT.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-32847, filed on Feb. 8, 2001 including specification, claims, drawings and summary, on which the Convention priority of the present application is based, are incorporated herein by reference in its entirety.

What is claimed is:

1. An apparatus for testing a semiconductor integrated circuit comprising:
   a test circuit board configured to transmit signals to and receive signals from a semiconductor integrated circuit to be tested, wherein the semiconductor integrated circuit comprises an A/D converter circuit to convert analog signals to digital signals and a D/A converter circuit to convert digital signals to analog signals;
   a test ancillary device which is disposed in the vicinity of said test circuit board and is connected to said test circuit board; and
   an external controller which assigns a numeric codes to tests to be conducted on said semiconductor integrated circuit by said test ancillary device and which transmits said numeric codes to said test ancillary device, wherein said test ancillary device comprises:
   memory having stored therein a test requirement table in which hardware requirements required for conducting the tests, which are applied to the test ancillary device, are set for each corresponding numeric code;
   an analysis section for reading test requirements corresponding to one of said numeric codes from said test requirement table;
   a data circuit for supplying a digital test signal to said D/A converter circuit of said semiconductor integrated circuit to be tested on the basis of said test requirements read by said analysis section;
   a testing D/A converter circuit which converts the digital test signal from said data circuit into an analog test signal and supplies said analog test signal to said A/D converter circuit of said semiconductor integrated circuit to be tested;
   a testing A/D converter circuit which converts an analog test output from said D/A converter circuit of said semiconductor integrated circuit to be tested into a digital test output; and
   measured data memory for storing the digital test output from said A/D converter circuit of said semiconductor integrated circuit to be tested and said digital test output from said testing A/D converter circuit,
   wherein a result of analysis of said each digital test outputs stored in said measured data memory, the analysis being performed by said analysis section, is sent to said external controller.

2. The apparatus for testing a semiconductor integrated circuit according to claim 1, wherein said external controller is a tester.

3. The apparatus for testing a semiconductor integrated circuit according to claim 1, wherein said memory having stored therein said test requirement table is incorporated in said analysis section.

4. The apparatus for testing a semiconductor integrated circuit according to claim 1, wherein said test ancillary device comprises:
   a test analysis table having a memory address table for setting an address of the measured data memory in which digital test outputs are stored for a corresponding numeric code;
   a computation method table having stored therein information about computation methods corresponding to respective numeric codes; and
   a test specification table in which specification evaluation values corresponding to the respective numeric codes are stored, wherein
   when an analysis start instruction is received from said external controller along with a numeric code, a predetermined digital test output is read from said memory address table; a corresponding computation method is read from the computation method table, thereby computing a characteristic parameter of said A/D converter circuit of said semiconductor integrated circuit to be tested and a characteristic parameter of said D/A converter circuit of the same; a result of computation is compared with a specification evaluation value corresponding to the numeric code read from said test specification table, thus evaluating a specification; and a result of evaluation is sent to said external controller.

5. The apparatus for testing a semiconductor integrated circuit according to claim 4, wherein said characteristic parameters correspond to a differential linearity and an integral nonlinearity error.

6. The apparatus for testing a semiconductor integrated circuit according to claim 4, wherein transmission information for sending a digital test output is provided in said test analysis table; and, when a numeric code corresponding to transmission information is sent to said test ancillary device from said external controller, said test ancillary device reads a corresponding digital test output from said measured data memory, and the digital test output is sent to said external controller.

7. The apparatus for testing a semiconductor integrated circuit according to claim 6, wherein the numeric code to be used for selecting transmission information is formed by combination of a code representing details of a test and a code to be used for selecting transmission information.

8. A method for testing a semiconductor integrated circuit comprising, a test circuit board configured to transmit signals to and receive signals from a semiconductor integrated circuit to be tested wherein the semiconductor integrated circuit comprises an A/D converter circuit to convert analog signals to digital signals and a D/A converter circuit to convert digital signals to analog signals, the methods comprising the steps of:

assigning a numeric code to each one of a test requirement stored in a test requirement table for tabulating hardware requirements for conducting test on said semiconductor integrated circuit to be tested;

reading a test requirement corresponding to one of said numeric codes from said test requirement table;

outputting a digital test signal on the basis of said test requirement read;

outputting the digital test signal to said D/A converter circuit of said semiconductor integrated circuit;

converting the digital test signal into an analog test signal and outputting the analog signal to said A/D converter circuit of said semiconductor integrated circuit;

converting an analog signal output from said D/A converter circuit to a first digital test output;

storing the first digital test output and storing a second digital test output from from said A/D converter circuit of said semiconductor integrated circuit;

conducting an analysis of the first digital test output and the second digital test output, and outputting a result of the analysis.

* * * * *